United States Patent
Satou et al.

(10) Patent No.: US 7,835,188 B2
(45) Date of Patent: Nov. 16, 2010

(54) SEMICONDUCTOR MEMORY DEVICE

(75) Inventors: Yutaka Satou, Chiba (JP); Fumiyasu Utsunomiya, Chiba (JP); Tomohiro Oka, Chiba (JP)

(73) Assignee: Seiko Instruments Inc., Chiba (JP)

( * ) Notice: Subject to any disclaimer, the term of this patent is extended or adjusted under 35 U.S.C. 154(b) by 120 days.

(21) Appl. No.: 12/361,620

(22) Filed: Jan. 29, 2009

(65) Prior Publication Data

US 2009/0190407 A1 Jul. 30, 2009

(30) Foreign Application Priority Data

Jan. 30, 2008 (JP) ............................. 2008-018554

(51) Int. Cl.
*G11C 16/00* (2006.01)

(52) U.S. Cl. ...................... 365/185.21; 365/185.09; 365/201

(58) Field of Classification Search ............. 365/185.02
See application file for complete search history.

(56) References Cited

U.S. PATENT DOCUMENTS 5,784,314 A * 7/1998 Sali et al. .................. 365/185.2
6,958,947 B2 * 10/2005 Park et al. .................. 365/228

FOREIGN PATENT DOCUMENTS

JP 11-16399 A 1/1999

* cited by examiner

*Primary Examiner*—Tan T. Nguyen
(74) *Attorney, Agent, or Firm*—Brinks Hofer Gilson & Lione

(57) ABSTRACT

Provided is a semiconductor memory device, which realizes characteristic evaluation even in a case where a threshold voltage is a negative potential by a test method which is similar to a case of a positive potential. The semiconductor memory device includes a plurality of memory cells for storing data. When a test signal is input, the semiconductor memory device changes from a normal mode to a test mode for evaluating characteristics of the plurality of memory cells. The semiconductor memory device also includes: a memory cell selecting portion for selecting a memory cell; a constant voltage portion for generating a reference voltage; a constant current portion for generating a reference current; an X switch voltage switching control circuit for supplying one of an X selection signal and a voltage signal input from an external terminal to a gate of the memory cell; a Y switch portion for supplying the reference current to a drain of the memory cell selected by a Y selection signal; a comparator for detecting whether or not a drain voltage that is a voltage of the drain has exceeded the reference voltage; and a decision level changing portion for adjusting a current value of the reference current and a voltage value of the reference voltage so as to change a decision level of the comparator based on a control signal in the test mode.

16 Claims, 10 Drawing Sheets

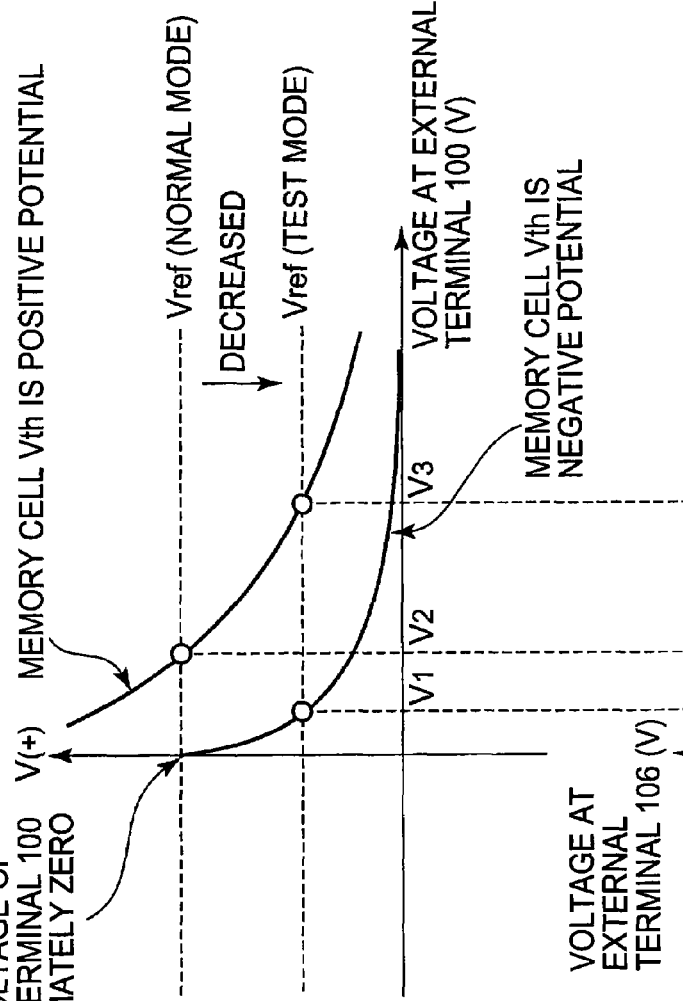
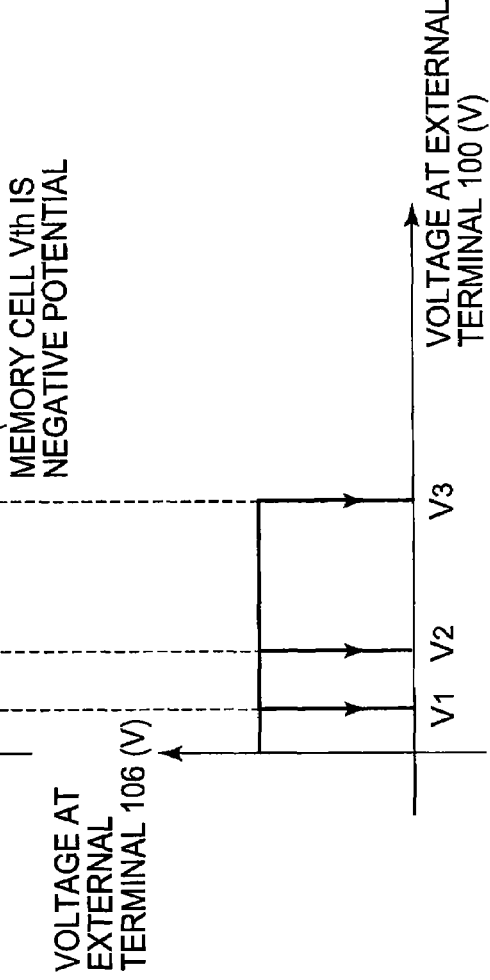
FIG. 8A
FIG. 8B

SEMICONDUCTOR MEMORY DEVICE

RELATED APPLICATIONS

This application claims priority under 35 U.S.C. §119 to Japanese Patent Application No. JP2008-018554 filed on Jan. 30, 2008, the entire content of which is hereby incorporated by reference.

BACKGROUND OF THE INVENTION

1. Field of the Invention

The present invention relates to a semiconductor memory device such as an EEPROM or a ROM capable of writing and erasing data electrically, which has an electrical measurement function that enables external and direct measurement of characteristics of a nonvolatile memory cell.

2. Description of the Related Art

Conventionally, individual memory cells in the semiconductor memory device are measured externally and directly for evaluating characteristics of the memory cells of a nonvolatile semiconductor memory device such as an EEPROM.

For instance, in the case of an EEPROM, when data is erased from or written in a memory cell M, electric characteristics such as a threshold voltage Vth of the memory cell M in each state are evaluated by setting a gate of the memory cell M from an external terminal 100 via a word line W1 in a variable manner as illustrated in FIG. 10 (in the case of erasing data) or in FIG. 11 (in the case of writing data) (see, for example, Japanese Patent Application Laid-open No. Hei 11-16399).

In the case of evaluating characteristics of the memory cell M from which data is erased as illustrated in FIG. 10, address data is input externally so that an X decoder 101 and a Y decoder 102 control an X switch voltage switching control circuit 105 and a Y switch 103 for selecting the memory cell M.

In the case of a normal mode in which a test signal T1 is not input, the X switch voltage switching control circuit 105 delivers a signal of the X decoder 101 to the word line W1. In the case of a test mode in which the test signal T1 is input, the X switch voltage switching control circuit 105 delivers a voltage of a fixed power supply 500 from the external terminal 100 to the word line W1.

Further, when a test signal T2 is input, a switch SW1 and a switch SW2 are switched so that a bit line B1 (i.e., drain of a selected memory cell M) is directly connected to an external terminal 106.

Thus, a value of current flowing from an external power supply 300 to the memory cell M is measured by an ammeter 201. The measured current value is compared with an expected value of current that is set in advance, and characteristics of the memory cell M are evaluated.

On the other hand, if the threshold voltage Vth of the memory cell becomes a positive potential when data is written, the gate of the memory cell M is set from the external terminal 100 via the word line W1 in a variable manner as illustrated in FIG. 11, similarly to FIG. 10.

Further, also in FIG. 11, similarly to FIG. 10, address data is input externally so that the X decoder 101 and the Y decoder 102 control the X switch voltage switching control circuit 105 and the Y switch 103 for selecting the memory cell M.

In addition, the test signal T1 is input and a voltage of a variable power supply 200 is applied to the gate of the memory cell M via the external terminal 100, but the test signal T2 is not input. Therefore, the switch SW1 connects the bit line B1 to a positive terminal of a comparator 107 while the switch SW2 connects an output terminal of the comparator 107 to the external terminal 106. Thus, a drain of the memory cell M is supplied with a reference current Iref from a constant current circuit 104.

As a result, the comparator 107 compares a drain voltage of the memory cell M (voltage converted from a current corresponding to a difference between the reference current Iref and the current flowing in the memory cell M) with a reference voltage Vref delivered from a constant voltage circuit 108. If the drain voltage exceeds the reference voltage Vref, an "H" level signal is delivered. If the drain voltage is below the reference voltage Vref, an "L" level signal is delivered.

Thus, a gate voltage of the memory cell M is varied, and characteristics of the memory cell are evaluated by detecting a change in the output logic delivered via the external terminal 106.

As described above, according to Japanese Patent Application Laid-open No. Hei 11-16399, if the threshold voltage Vth of the memory cell M is a negative potential, both the test signals T1 and T2 are input, the gate voltage is controlled externally, and current flowing in the drain is measured at the external terminal 106. On the other hand, if the threshold voltage Vth of the memory cell M is a positive potential, only the test signal T1 is input, the gate voltage is controlled externally, and decision for characteristic evaluation is performed by voltage comparison using the comparator similarly to the normal mode.

However, the method of evaluating characteristics of a memory cell described in Japanese Patent Application Laid-open No. Hei 11-16399 can evaluate characteristics of the memory cell M at high speed if the threshold voltage Vth of the memory cell M is a positive potential, because the current difference between the current flowing in the memory cell M and the reference current Iref is converted into a voltage, and the voltage as the conversion result is compared with the reference voltage Vref by the comparator of the internal circuit. On the other hand, if the threshold voltage Vth of the memory cell M is a negative potential, it takes a longer period of time until the current value becomes stable because the evaluation is performed by measuring current using the external ammeter 201.

Therefore, if the threshold voltage Vth is a negative potential, it takes approximately ten times the test time in the case of a positive potential. As the memory cell capacity is larger, the manufacturing cost is higher.

For this reason, it is considered to adopt the same test method also in the case where the threshold voltage Vth is a negative potential as in the case where the threshold voltage Vth is a positive potential. In this case, it is necessary to supply a negative voltage from the external terminal 100 to the gate of the memory cell M.

However, when the test is performed, a voltage of Vss or lower (0 V if Vss is zero) cannot be applied to the semiconductor device including parasitic diodes everywhere. Therefore, if the threshold voltage Vth is a negative potential, the same test method as in the case of a positive potential cannot be used in the conventional circuit structure.

SUMMARY OF THE INVENTION

The present invention has been made in view of the above-mentioned circumstance, and therefore it is an object thereof to provide a semiconductor memory device that realizes the test method that is the same as in the case where the threshold voltage is a positive potential even in the case where the threshold voltage is a negative potential.

A semiconductor memory device of the present invention is a semiconductor memory device including a plurality of memory cells for storing data. The semiconductor memory device changes from a normal mode for writing and reading the data normally to a test mode for evaluating characteristics of the plurality of memory cells when a test signal is input. The semiconductor memory device includes: a memory cell selecting portion for delivering an X selection signal and a Y selection signal for selecting a memory cell corresponding to an external address; a constant voltage portion for generating a reference voltage; a constant current portion for generating a reference current; an X switch voltage switching control circuit for supplying one of the X selection signal and a voltage signal input from an external terminal to a gate of the memory cell; a Y switch portion for supplying the reference current to a drain of the memory cell selected by the Y selection signal; a comparator for detecting whether or not a drain voltage that is a voltage of the drain has exceeded the reference voltage; and a decision level changing portion for adjusting at least one of the a current value of the reference current and a voltage value of the reference voltage so as to change a decision level of the comparator based on a control signal input in the test mode.

In the semiconductor memory device of the present invention, the X switch voltage switching control circuit changes a voltage value of the voltage signal input from the external terminal and measures a threshold voltage of the memory cell based on a change in logic level of an output of the comparator in the test mode.

In the semiconductor memory device of the present invention, the decision level changing portion controls the current value of the reference current based on the control signal input externally in the test mode.

In the semiconductor memory device of the present invention, the decision level changing portion includes: a transistor for generating a reference current in the normal mode; and a multi-output current mirror circuit in which a plurality of adjusting transistors for adjusting the reference current in the test mode are connected in parallel. A switch transistor is connected in series to each of the plurality of adjusting transistors, and a combination of the plurality of adjusting transistors to be added to the reference current in the test mode is controlled by ON and OFF of the switch transistors with respect to the reference current in the normal mode.

In the semiconductor memory device of the present invention, the decision level changing portion includes a mirror circuit. When a value of current flowing in a transistor to mirror is controlled in the test mode, a value of current flowing in a transistor to be mirrored is controlled by the control signal input externally, and the reference current is controlled.

In the semiconductor memory device of the present invention, the decision level changing portion controls the reference voltage by the control signal input externally when the test signal is input.

In the semiconductor memory device of the present invention, the decision level changing portion includes a power supply circuit including a first MOS transistor and a second MOS transistor that are connected in series between a power supply and a ground point, and in the test mode, adjusts current flowing in the first MOS transistor in an upper stage by the control signal input externally while delivering a voltage generated at a node of connection to the second MOS transistor in a lower stage as the reference voltage.

As described above, according to the present invention, even if the threshold voltage of the transistor of the memory cell becomes a negative potential, at least one of the reference current and the reference voltage can be adjusted. Therefore, when the characteristics of the voltage memory cell are evaluated by changing to the decision level for evaluating the characteristics, even if the threshold voltage of the memory cell is a negative potential, it is possible to control within the adjustment range of a static potential of a variable voltage to be applied to the gate of the memory cell so that the same test method as in the case where the threshold voltage is a positive potential can be used. Thus, compared with the conventional memory cell test method, the test time can be shortened substantially so that manufacturing cost can be reduced.

In addition, according to the present invention, even if the threshold voltage is a negative potential, the same measuring method as in the case where the threshold voltage is a positive potential can be used as described above. Therefore, the switches SW1 and SW2 that are necessary in the conventional structure can be eliminated. Hence, a circuit structure can be simplified and a circuit scale can be reduced.

BRIEF DESCRIPTION OF THE DRAWINGS

In the accompanying drawings:

FIGS. 8A and 8B are graphs illustrating an adjustment of a reference voltage in evaluating characteristics of a memory cell according to the second embodiment;

DETAILED DESCRIPTION OF THE PREFERRED EMBODIMENTS

Figure 1:
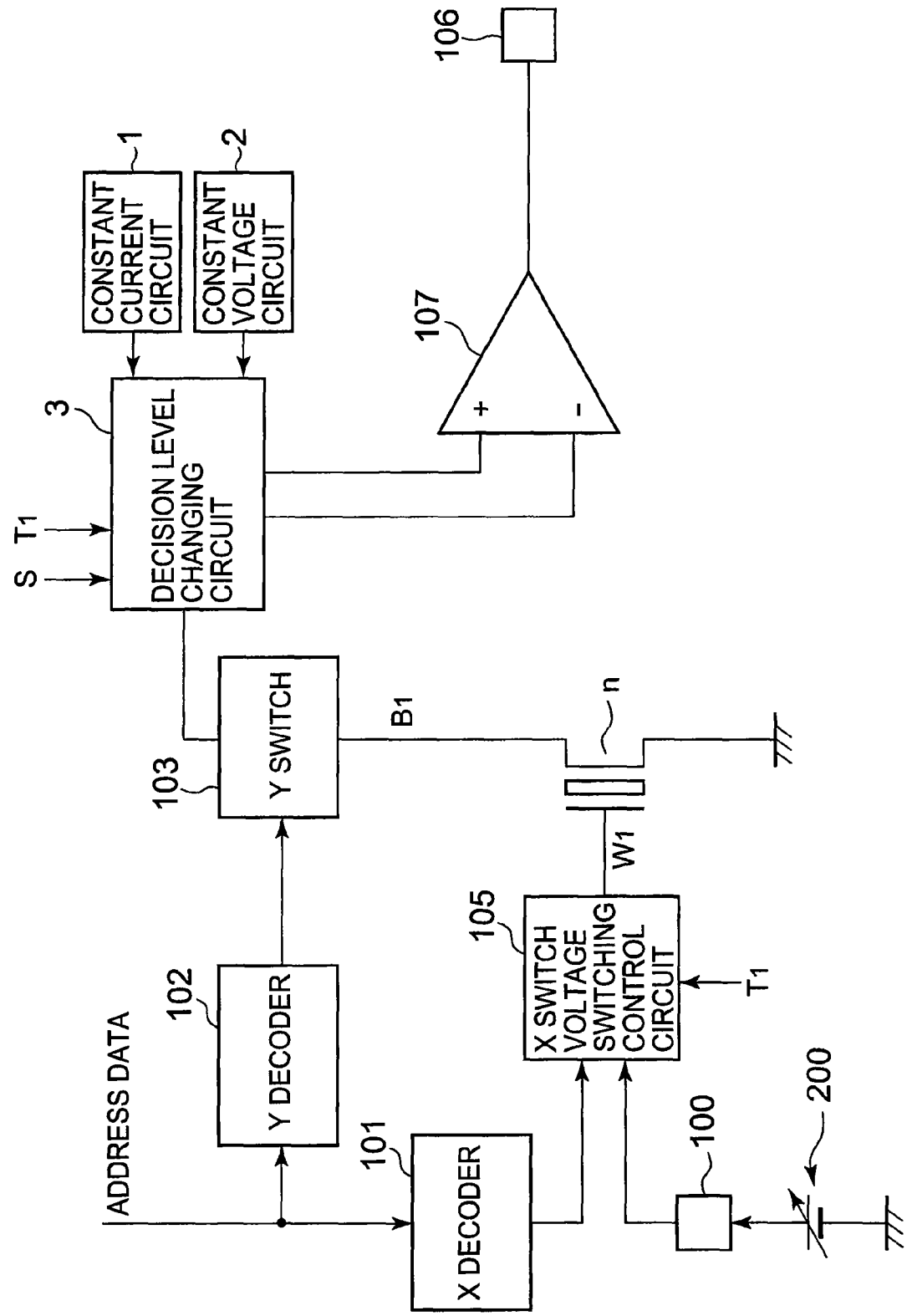
FIG. 1 is a block diagram illustrating a structural example of a semiconductor memory device according to an embodiment of the present invention.

Hereinafter, a semiconductor memory device according to an embodiment of the present invention is described with reference to the attached drawings. FIG. 1 is a block diagram illustrating a structural example of this embodiment.

In this diagram, the semiconductor memory device of this embodiment includes a memory matrix in which a plurality of bit lines and a plurality of word lines are arranged like a grid, and memory cells M are disposed at individual intersections thereof. In other words, this memory matrix includes a plurality of memory cells M, and a drain of each memory cell M is connected to one of adjacent bit lines while a gate thereof is connected to one of adjacent word lines. Hence, the plurality of memory cells M are arranged like a matrix.

In addition, the semiconductor memory device of this embodiment also includes a constant current circuit 1, a constant voltage circuit 2, a decision level changing circuit 3, an X decoder 101, a Y decoder 102, a Y switch 103, and a comparator 107. Here, the memory cell M in this embodiment has a floating gate structure constituted by an n-channel type MOS transistor, for example.

In addition, when a test signal T1 is not supplied, the semiconductor memory device is in a normal mode in which normal reading and writing is performed for the memory cell M. On the contrary, when the test signal T1 is supplied, the semiconductor memory device is in a test mode in which a characteristic of a target memory cell M is evaluated.

The X decoder 101 selects one of the plurality of word lines in accordance with address data input externally so as to control an X switch voltage switching control circuit 105 for activating a selected word line W1 (in this embodiment, the memory cell M is an n-channel transistor, and hence the word line W1 is changed from the "L" level to the "H" level by the activation).

The Y decoder 102 selects one of the plurality of bit lines in accordance with address data input externally so as to control the Y switch 103. Thus, a selected bit line B1 is connected to the constant current circuit 1 described above, and hence a reference current Iref flows in the selected bit line B1.

The decision level changing circuit 3 in the normal mode supplies the reference current Iref to a drain of the memory cell M from the constant current circuit 1. In addition, the decision level changing circuit 3 delivers an output voltage of the constant voltage circuit 2 as a reference voltage Vref to a negative terminal of the comparator 107.

On the other hand, the decision level changing circuit 3 in the test mode adjusts at least one of the reference current Iref delivered from the constant current circuit 1 and the reference voltage Vref delivered from the constant voltage circuit 2 in accordance with a control signal S input externally, so as to change a decision level of a threshold voltage Vth of the memory cell M, in evaluation of the characteristics of the memory cell M.

The X switch voltage switching control circuit 105 selects one of a voltage delivered from the X decoder 101 for activating the word line W1 and a voltage signal of a variable power supply 200 input via an external terminal 100 in accordance with whether or not the test signal T1 is input, and delivers the selected one to the word line W1. Here, if the test signal T1 is input (in the case of the test mode), the X switch voltage switching control circuit 105 delivers the voltage signal from the variable power supply 200 to the word line W1. If the test signal T1 is not input (in the case of the normal mode), the X switch voltage switching control circuit 105 delivers a voltage signal for selecting the word line. This voltage signal is applied as a controlled arbitrary voltage value from the external variable power supply 200.

Both in the normal mode and in the test mode, the comparator 107 compares the drain voltage of the memory cell M that is supplied to the positive terminal thereof with the reference voltage Vref supplied to the negative terminal thereof. Then, the characteristic evaluation such as detection of the threshold voltage Vth of the memory cell M is performed base on a change in logic of the output terminal between the case where the drain voltage is higher than the reference voltage Vref and the case where the drain voltage is lower than the reference voltage Vref. Here, the drain voltage of the memory cell M is a voltage determined by an ON resistance of the memory cell M and the reference current Iref.

Hereinafter, the process of changing the decision level of the threshold voltage Vth in the memory cell according to embodiments is described.

First Embodiment

Figure 2:
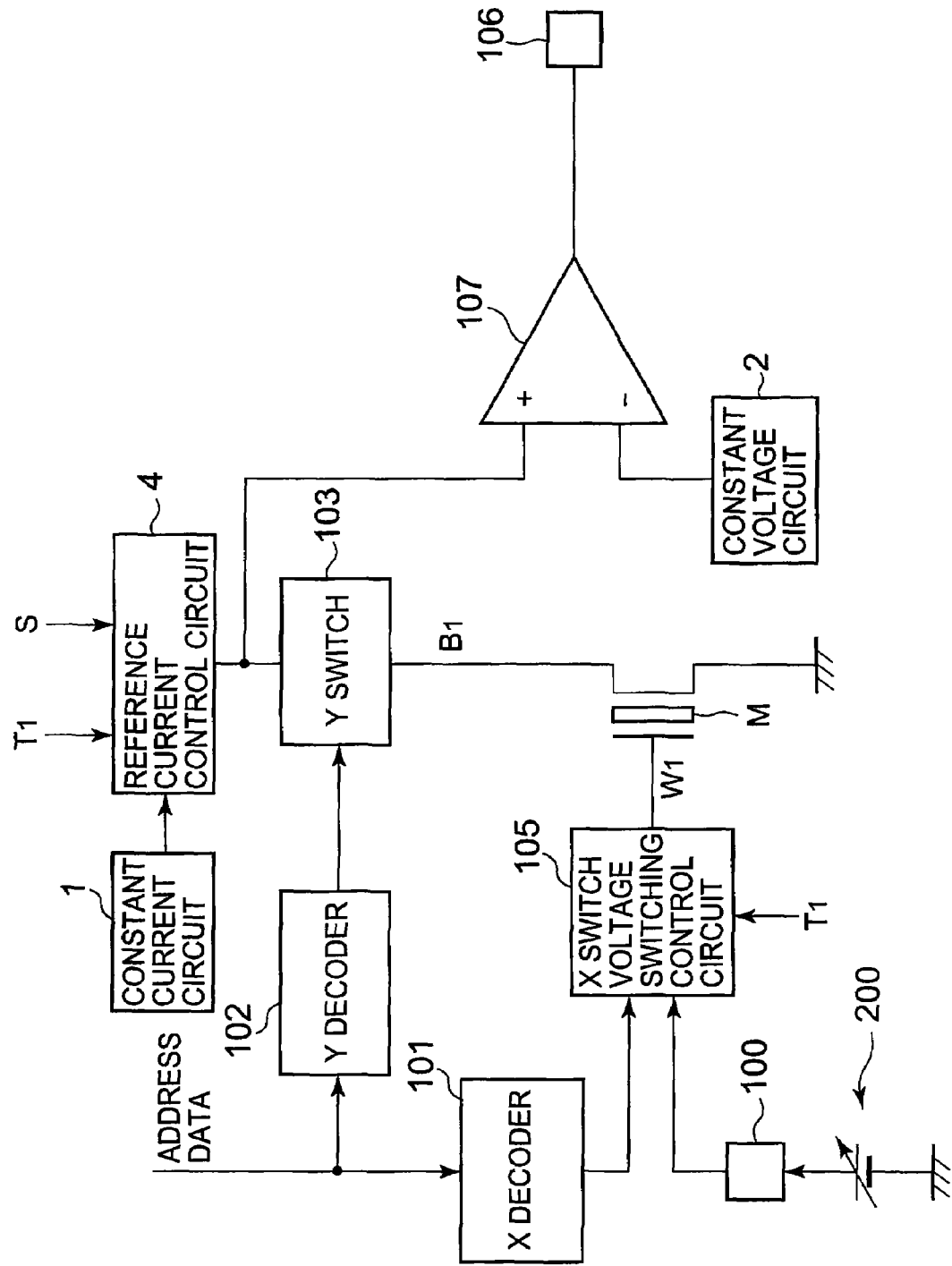
FIG. 2 is a block diagram illustrating a structural example of a semiconductor memory device according to a first embodiment of the present invention.

A semiconductor memory device according to a first embodiment is described with reference to FIG. 2. FIG. 2 is a block diagram illustrating a structural example of the semiconductor memory device according to this embodiment.

In the first embodiment, the decision level changing circuit 3 is constituted as a reference current control circuit 4 as illustrated in FIG. 2.

When the test signal T1 is not input, the reference current control circuit 4 supplies the constant current that is an output of the constant current circuit 1 as the reference current Iref to the memory cell M via the Y switch 103. In contrast, when the test signal T1 is input, the reference current control circuit 4 changes the current value of the reference current Iref to be a larger current value than that of the constant current in accordance with the control signal S, and supplies the changed current as the reference current Iref to the memory cell M via the Y switch 103.

As described above, when data is written in the memory cell M of the EEPROM (i.e., an electron is injected in the floating gate), the threshold voltage Vth becomes a positive potential. When data is erased (i.e., an electron is extracted from the floating gate), the threshold voltage Vth is apt to be a negative potential.

Figure 3:
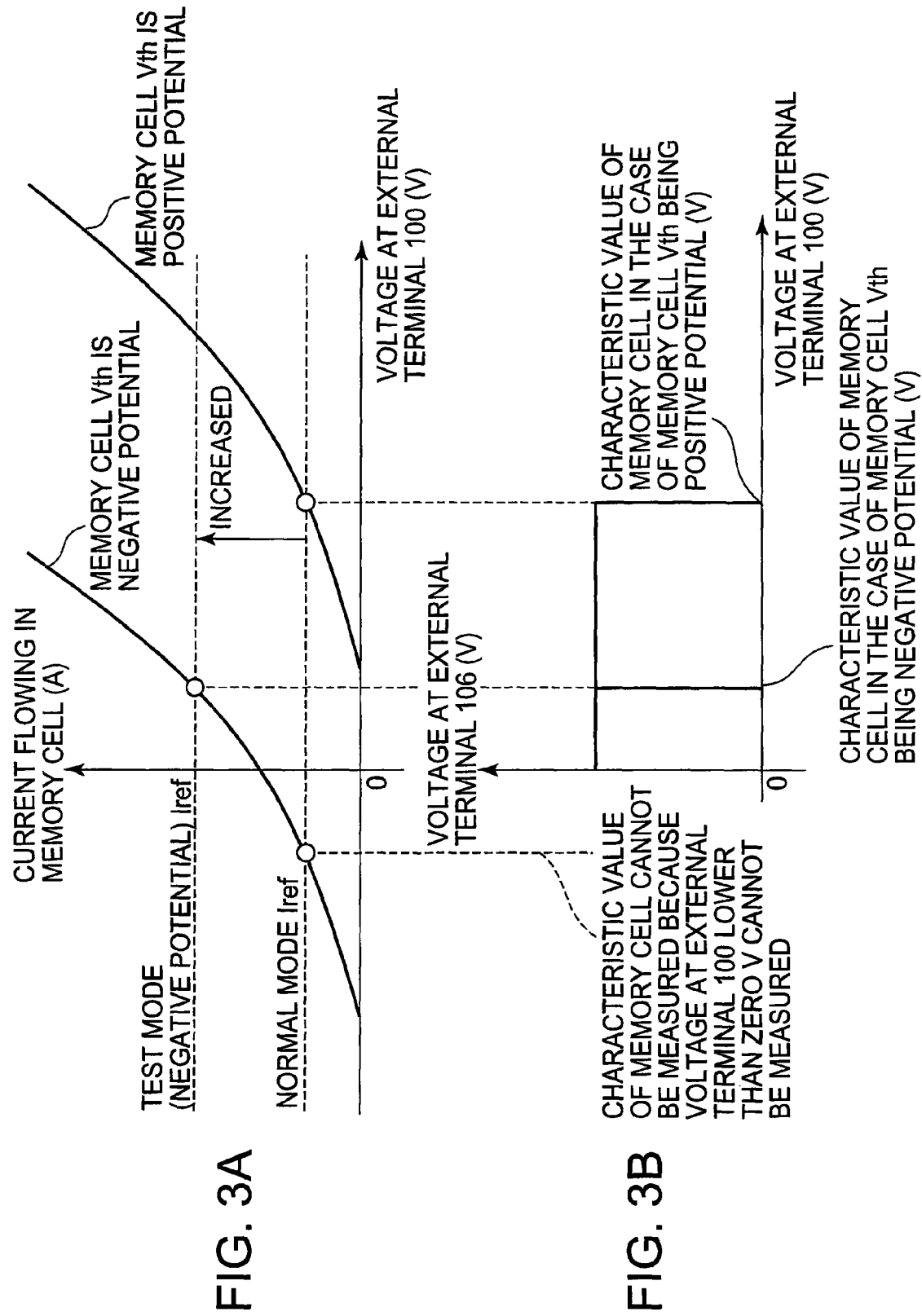
FIGS. 3A and 3B are graphs illustrating an adjustment of a reference current in evaluating characteristics of a memory cell according to the first embodiment.

Therefore, as illustrated in FIGS. 3A and 3B, if the threshold voltage Vth is a positive potential in the test mode, the voltage value of the voltage signal to be applied to the gate of the memory cell M from the external terminal 100 is gradually decreased from a certain value (i.e., voltage sufficiently higher than the threshold voltage of the memory cell), and hence the ON resistance of the memory cell M is gradually increased. In FIG. 3A, the horizontal axis represents the voltage value of the voltage signal supplied from the external terminal 100 while the vertical axis represents the current value of the current flowing in the memory cell M. Further, in FIG. 3B, the horizontal axis represents the voltage value of the voltage signal supplied from the external terminal 100 while the vertical axis represents a value of the voltage delivered to an external terminal 106.

In this case, if the voltage value of the voltage signal applied to the gate of the memory cell M is higher than that of the threshold voltage Vth of the memory cell M, the ON resistance of the memory cell M is sufficiently small for the reference current Iref. Therefore, the voltage at the positive input terminal of the comparator 107 is lower than the reference voltage Vref at the negative input terminal thereof, and hence a logical output of the "L" level is delivered from the output terminal thereof.

However, if the voltage value of the voltage signal to be applied to the gate is decreased to be lower than that of the threshold voltage Vth of the memory cell M, the ON resistance of the memory cell M increases as described above. Then, the reference current Iref cannot flow sufficiently, and hence the drain voltage increases. When the voltage at the positive input terminal (i.e., drain voltage) of the comparator 107 exceeds the reference voltage Vref at the negative input terminal thereof, the logical output delivered from the output terminal thereof is changed from the "L" level to the "H" level. This change in logical output enables to detect the threshold voltage Vth of the positive potential.

On the other hand, if the threshold voltage of the memory cell M is a negative potential, and if the current value of the reference current Iref when the threshold voltage Vth is a positive potential is used as illustrated in FIGS. 3A and 3B, the voltage signal applied to the gate of the memory cell M is out of the adjustment range of the voltage signal that can be measured by the comparator 107. In other words, if the threshold voltage Vth of the memory cell M is a negative potential, the ON resistance of the memory cell M is very small. The ON resistance cannot be increased to the extent that the drain voltage exceeds the reference voltage Vref unless the voltage signal of the negative potential is applied to the gate. However, as described above as a problem to be solved, the negative potential cannot be input from the external terminal 100.

Therefore, when the threshold voltage Vth of the negative potential is evaluated in the test mode, the ON resistance of the memory cell M is smaller compared with the case where the threshold voltage Vth is a positive potential. In order to increase the ON resistance of the memory cell M apparently, the current value of the reference current Iref is increased compared with the case of the positive potential.

As described above, if the ON resistance becomes the value that does not enable the increased reference current Iref to flow sufficiently even if the memory cell M is completely not turned off in the range where the voltage of the gate of the memory cell M is a positive potential as illustrated in FIGS. 3A and 3B when the current value of the reference current Iref is increased, the drain voltage exceeds the reference voltage Vref so that the logical output of the comparator 107 is changed.

As described above, a relationship between the threshold voltage Vth of the negative potential and the increased reference current Iref is determined in advance, and hence the threshold voltage Vth of the negative potential can be measured.

Figure 4:
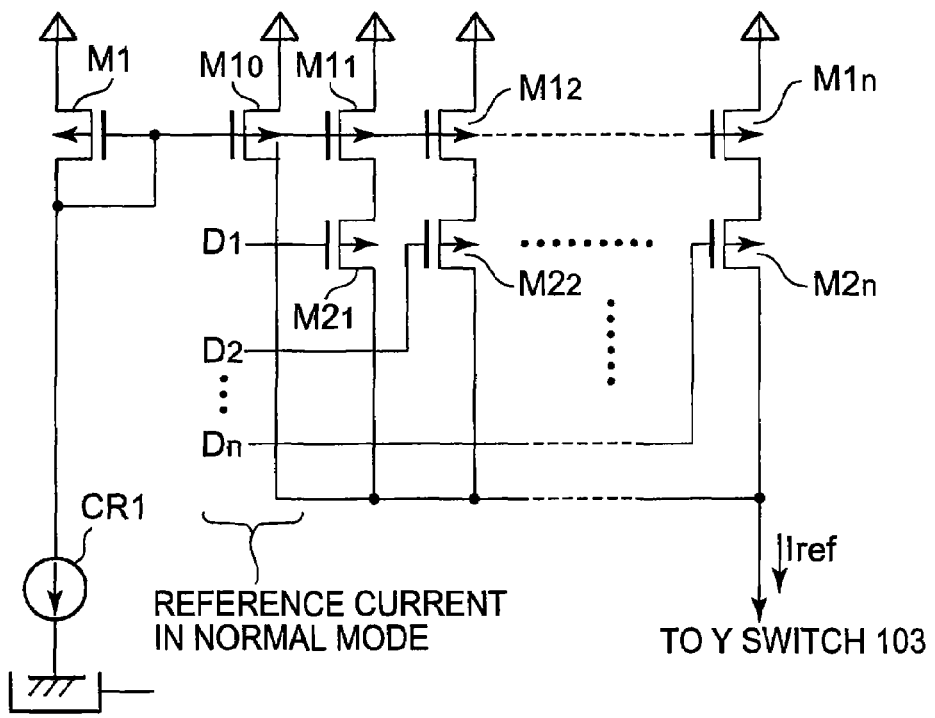
FIG. 4 is a block diagram illustrating a structural example of a reference current control circuit illustrated in FIG. 2.

In addition, the reference current control circuit 4 described above can be constituted by the multi-output current mirror circuit illustrated in FIG. 4, for example.

This multi-output current mirror circuit is made of transistors M1, $M1_0$, $M1_1$, $M1_2$, ..., $M1_n$, $M2_1$, $M2_2$, ... and $M2_n$ that are p-channel type MOS transistors, and a constant current source CR1.

The transistor M1 and the constant current source CR1 constitute a bias circuit for generating the reference current. The transistor M1 is connected like a diode. In other words, the source is connected to the power supply voltage, the gate is connected to the drain, and the drain is connected to the constant current source CR1 described above.

In addition, a source of each of the transistors $M1_0$, $M1_1$, $M1_2$, ... and $M1_n$ is connected to the power supply voltage, a gate thereof is connected to the gate of the transistor M1 (a bias voltage is applied), and hence each of the transistors constitutes a duplicated current source.

Here, the transistor $M1_0$ supplies the reference current Iref of the current value that is necessary for reading data stored in the memory cell M in a normal mode.

The other transistors $M1_1$, $M1_2$, ... and $M1_n$ are made to have the same size or different sizes and are disposed for adjusting the current value of the reference current Iref in the test mode.

The drains of the transistors $M1_1$, $M1_2$, ... and $M1_n$ are connected to the sources of the transistors $M2_1$, $M2_2$, ... and $M2_n$, respectively.

In addition, the drains of the transistors $M1_0$ and the transistors $M2_1$, $M2_2$, ... and $M2_n$ are connected to each other at the same node, which is connected to the Y switch 103.

The gates of the transistors $M2_1$, $M2_2$, ... and $M2_n$ are supplied with control signals $D_1$, $D_2$, ... and $D_n$ in control signals $S\{D_1, D_2, D_3, \ldots, D_n\}$.

If the test signal T1 is input, the reference current control circuit 4 supplies the control signals $S\{D_1, D_2, D_3, \ldots, D_n\}$ to the corresponding transistors $M2_1$, $M2_2$, ... and $M2_n$, respectively. Thus, a value of the current flowing in the transistor connected in series to the turned-on transistor among the transistors $M2_1$, $M2_2$, ... and $M2_n$ (one or more transistors among the transistors $M1_1$, $M1_2$, ... and $M1_n$) is added to a value of the current flowing in the transistor $M1_0$. A result of the adding is supplied as the reference current Iref to the memory cell M via the Y switch 103.

On the contrary, if the test signal T1 is not input, the reference current control circuit 4 applies the "H" level voltage to all the gates of the transistors $M2_1$, $M2_2$, ... and $M2_n$, which are turned off so that only the reference current Iref of the transistor $M1_0$ is supplied to the memory cell M via the Y switch 103.

In addition, if the threshold voltage Vth of the memory cell M to be evaluated is a positive potential in the test mode, it is possible to evaluate characteristics of the memory cell M based on the reference current Iref of the current value that is the same as that in the normal mode.

Therefore, the control signals $S\{D_1, D_2, D_3, \ldots, D_n\}$ are set to be $S\{H, H, H, \ldots, H\}$ so that all the transistors $M2_1$, $M2_2$, ... and $M2_n$ are turned off. The reference current Iref of only the current value of the transistor $M1_0$ is used, and the voltage value of the voltage signal supplied from the external terminal 100 is changed within the range of a positive potential from the voltage that is sufficiently higher than the threshold voltage Vth to zero, whereby the characteristics of the memory cell M can be evaluated.

On the contrary, if the threshold voltage Vth of the memory cell M to be evaluated is a negative potential, it is necessary to apply the voltage signal of a negative voltage value to the gate of the memory cell M as described above in order that the drain voltage exceeds the reference voltage Vref by completely turning off the memory cell M. Therefore, the process for increasing the reference current Iref is performed.

For this reason, for instance, the control signals $S\{D_1, D_2, D_3, \ldots, D_n\}$ are set to be $S\{L, H, L, \ldots, L\}$ so that the transistors $M2_1$, $M2_3$ and $M2_n$ are turned on. With respect to the current value of the transistor $M1_0$, a current value of a duplicated current of the transistor M1 that flows in the transistors $M1_1$, $M1_3$ and $M1_n$ is added to the current value of the transistor $M1_0$, and the current value of the reference current Iref is increased compared with the case of the normal mode. In the adjustment within the voltage range of a positive potential of the voltage signal, the drain voltage of the memory cell M is made to exceed the voltage value of the reference voltage Vref, whereby the characteristics of the memory cell M can be performed by applying the voltage signal within the voltage range of a positive potential to the gate of the memory cell M.

Figure 5:
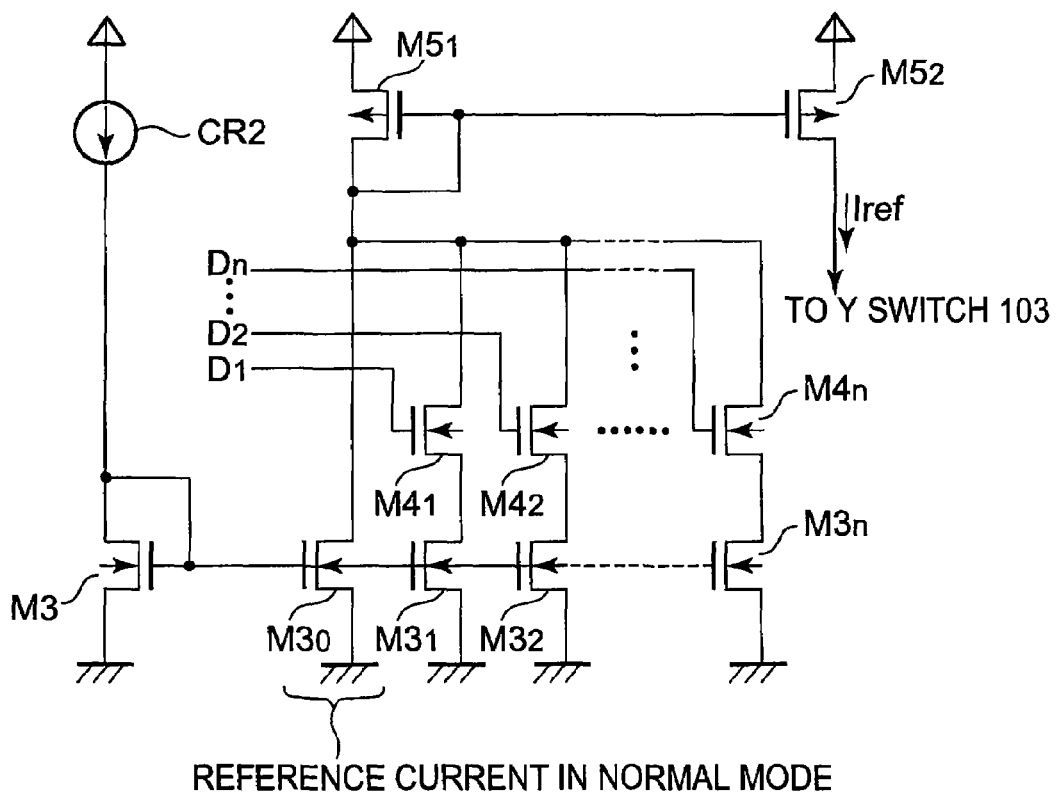
FIG. 5 is a block diagram illustrating another structural example of the reference current control circuit illustrated in FIG. 2.

In addition, as illustrated in FIG. 5, for example, the reference current control circuit 4 may have a circuit structure in which a combination of outputs of a multi-output current mirror duplicated from a first reference current generated by the bias circuit made of the constant current source CR1 and the transistor M3 is made to be a second reference current, and the reference current Iref is generated from the second reference current as the duplicated current.

This multi-output current mirror circuit is made of transistors M3, $M3_0$, $M3_1$, $M3_2$, ..., $M3_n$, $M4_1$, $M4_2$, ... and $M4_n$ that are n-channel type MOS transistors, transistors $M5_1$ and $M5_2$ that are p-channel type MOS transistors, and a constant current source CR2.

The transistor M3 and the constant current source CR2 constitute the bias circuit for generating the first reference current as described above. The transistor M3 is connected like a diode. In other words, in the transistor M3, a source is connected to the ground, a gate is connected to a drain, and the drain is connected to the constant current source CR2 described above.

In addition, a source of each of the transistors $M3_0$, $M3_1$, $M3_2$, ... and $M3_n$ is connected to the power supply voltage, a gate thereof is connected to the gate of the transistor M3 (a bias voltage of the bias circuit is applied to the gate), whereby each of the transistors constitutes a duplicated current source.

Here, the transistor $M3_0$ supplies the reference current Iref of the current value that is necessary for reading data stored in the memory cell M in the normal mode.

The other transistors $M3_1$, $M3_2$, ... and $M3_n$ are made to have the same size or different sizes and are disposed for adjusting the current value of the reference current Iref by adding the selected current to the current of the transistor $M3_0$ in the test mode.

The sources of the transistors $M3_1$, $M3_2$, ... and $M3_n$ are connected to the ground while the drains thereof are connected respectively to sources of the transistors $M4_1$, $M4_2$, ... and $M4_n$.

In addition, drains of the transistors $M4_1$, $M4_2$, ... and $M4_n$ are connected to each other at the same node, which is connected to a drain of the transistor $M5_1$.

Gates of the transistors $M4_1$, $M4_2$, ... and $M4_n$ are supplied with the control signals $D_1$, $D_2$, ... and $D_n$ in the control signals $S\{D_1, D_2, D_3, \ldots, D_n\}$.

If the test signal T1 is input, the reference current control circuit 4 supplies the control signals $S\{D_1, D_2, D_3, \ldots, D_n\}$ to the corresponding gates of the transistors $M4_1$, $M4_2$, ... and $M4_n$, respectively. If the test signal T1 is not input, the reference current control circuit 4 applies the "L" level to all the gates of the transistors $M4_1$, $M4_2$, ... and $M4_n$, which are turned off so that only the current value of the transistor $M3_0$ is generated as the first reference current.

The transistor $M5_1$ is connected like a diode. In other words, in the transistor $M5_1$, a source is connected to the power supply voltage, and a gate is connected to the drain.

A current value of a combination of the transistor $M3_0$ for causing the current duplicated from the first reference current to flow and the transistors $M3_1$ to $M3_n$ for causing the current duplicated from the first reference current to flow is added, and a current value as a result of the adding flows as the second reference current in the transistor $M5_1$.

A source of the transistor $M5_2$ is connected to the power supply voltage while a gate thereof is connected to the gate of the transistor $M5_1$ (i.e., the voltage at the drain of the transistor $M5_1$ is applied as the bias voltage to the gate). A drain of the transistor $M5_2$ is connected to the Y switch 103, and the reference current Iref is supplied as the duplicated current from the second reference current to the memory cell M via the Y switch 103.

As described above, if the threshold voltage Vth of the memory cell M to be evaluated is a positive potential in the test mode, the characteristics of the memory cell M can be evaluated based on the reference current Iref of the current value that is the same as that in the normal mode.

Therefore, the control signals are set to be $S\{D_1, D_2, D_3, \ldots, D_n\}$ are set to $S\{L, L, L, \ldots, L\}$ so that all the transistors $M4_1$, $M4_2$, ... and $M4_n$ are turned off. Only the current value of the transistor $M3_0$ is used for generating the second reference current, and the reference current Iref as the duplicated current from the second reference current is used for changing the voltage value of the voltage signal supplied from the external terminal 100 within the range of a positive potential from the voltage that is sufficiently larger than the threshold voltage Vth to zero, whereby the characteristics of the memory cell M can be evaluated.

On the contrary, if the threshold voltage Vth of the memory cell M to be evaluated is a negative potential, the control signals $S\{D_1, D_2, D_3, \ldots, D_n\}$ are set to be $S\{L, H, L, \ldots, H\}$ so that the transistors $M4_2$ and $M4_n$ are turned on, for instance, in order that the drain voltage of the memory cell M exceeds the reference voltage Vref as described above. The current values of the transistors $M1_2$ and $M1_n$ are added to the current value of the transistor $M3_0$, and the current value of the second reference current is increased compared with the case of the normal mode. The current value of the duplicated reference current Iref is increased, and the drain voltage of the memory cell M is made to exceed the voltage value of the reference voltage Vref within the voltage range of a positive potential, whereby the characteristics of the memory cell M can be performed by adding the voltage signal of the voltage range of a positive potential to the gate of the memory cell M in the case where the threshold voltage Vth is a negative potential.

Figure 6:
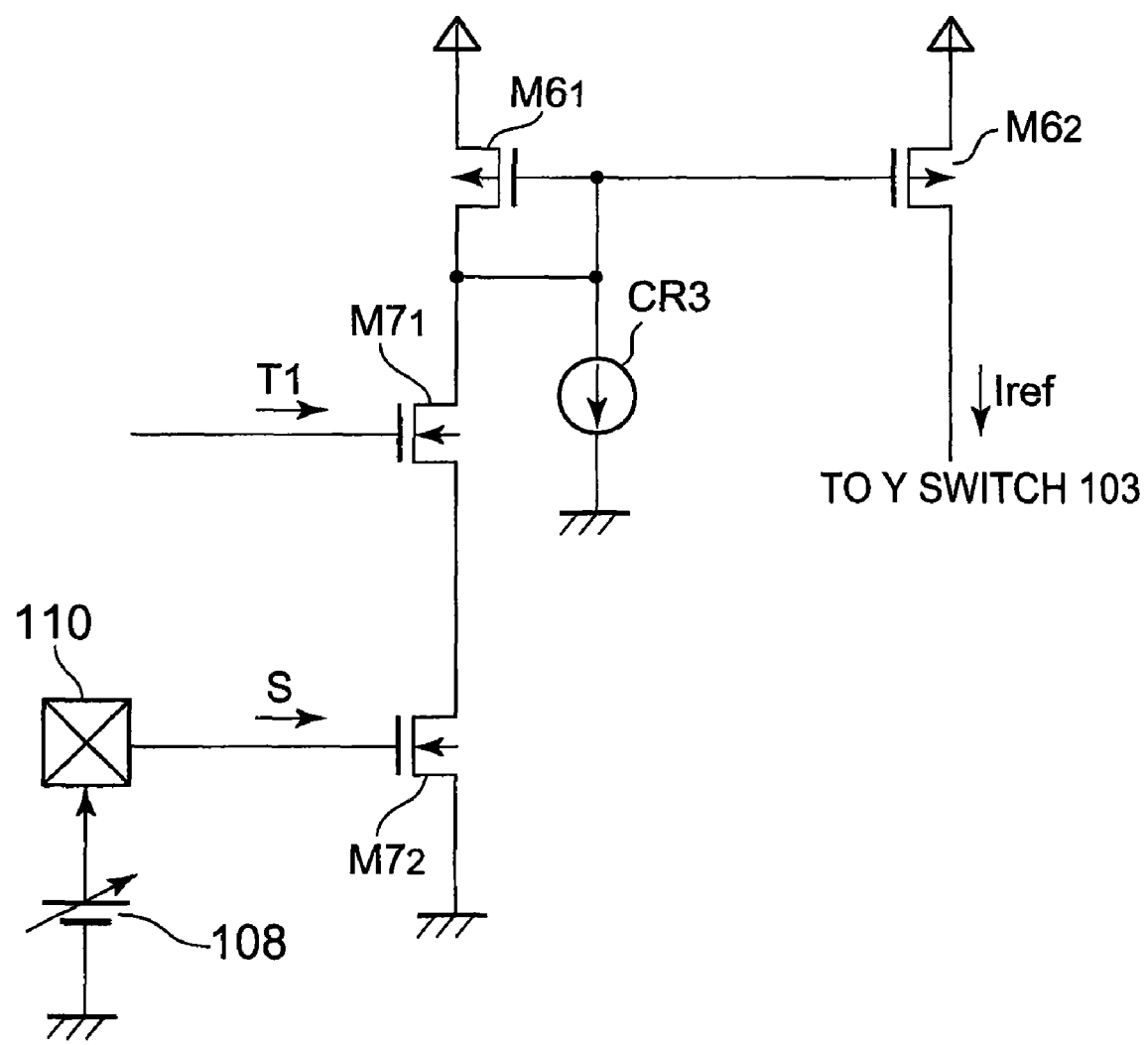
FIG. 6 is a block diagram illustrating a further structural example of the reference current control circuit illustrated in FIG. 2.

In addition, the reference current control circuit 4 may have a circuit structure as illustrated in FIG. 6, for example, in which when the test signal T1 is input, the current value of the reference current Iref is adjusted arbitrarily by the voltage value of the control signal S applied from an external terminal 110 (an analog signal delivered from a variable power supply in the structure of FIG. 6).

The reference current control circuit 4 is made of transistors $M6_1$ and $M6_2$ that are p-channel type MOS transistors, transistors $M7_1$ and $M7_2$ that are n-channel type MOS transistors, and a constant current source CR3.

The transistor $M6_1$ and the constant current source CR3 constitute a bias circuit for generating the reference current in the normal mode. The transistor $M6_1$ is connected like a diode, i.e., in the transistor $M6_1$, a source is connected to the power supply voltage, a gate is connected to a drain, and the drain is connected to the constant current source CR3.

A drain of the transistor $M7_1$ is connected to the drain of the transistor $M6_1$, a gate thereof is connected to a signal line of the test signal T1, and a source thereof is connected to a drain of the transistor $M7_2$. In addition, a gate of the transistor $M7_2$ is connected to the external terminal 110, and a source thereof is connected to the ground.

A source of the transistor $M6_2$ is connected to the power supply voltage, a gate thereof is connected to the gate of the transistor $M6_1$ and a drain thereof is connected to the Y switch 103, so as to duplicate the reference current and deliver the reference current as the reference signal Iref to the Y switch 103.

Here, the gate of the transistor $M7_2$ is supplied with the control signal S of an arbitrary voltage value from an external variable power supply 108 via the external terminal 110.

If the test signal T1 is not input, i.e., if the "L" level voltage is applied to the gate of the transistor $M7_1$ the transistor $M_7$ is turned off. Thus, only a constant current from the constant current source CR3 is duplicated by the transistor $M6_2$, and is supplied as the reference current Iref to the memory cell M via the Y switch 103.

As described above, if the threshold voltage Vth of the memory cell M to be evaluated is a positive potential in the test mode, the characteristics of the memory cell M can be evaluated by the reference current Iref having the same current value as that in the normal mode.

Therefore, because the test signal T1 of the "H" level is supplied and the transistor $M7_1$ is turned on, the voltage value of the control signal S is made to be equal to or lower than the threshold voltage of the transistor $M7_2$ so that the transistor $M7_2$ is turned off, to thereby control so that a current does not flow in the transistor $M7_2$.

In this way, only the constant current from the constant current source CR3 flows in the transistor $M6_1$, and the constant current is made to be the reference current similarly to the normal mode in which the transistor $M7_1$ is turned off.

Then, the transistor $M6_2$ duplicates the reference current, and the duplicated current is delivered as the reference current Iref from the drain of the transistor $M6_2$ to the Y switch 103.

On the contrary, if the threshold voltage Vth of the memory cell M to be evaluated is a negative potential, the memory cell M is completely turned off so that the drain voltage exceeds the reference voltage Vref by, for example, increasing the voltage value of the control signal S (i.e., voltage value of the variable power supply 108), adjusting the current flowing in the transistor $M7_2$, adding a value of the current flowing in the transistor $M7_2$ to the constant current from the constant current source CR3, increasing the current value of the reference current flowing in the transistor $M6_1$ compared with that in the normal mode, increasing the current value of the reference current Iref duplicated by the transistor $M6_2$, and making the drain voltage of the memory cell M exceed the voltage value of the reference voltage Vref within the range of a positive potential voltage. Thus, the characteristics of the memory cell M can be evaluated by applying the voltage signal within the positive potential voltage range to the gate of the memory cell M.

Second Embodiment

Figure 7:
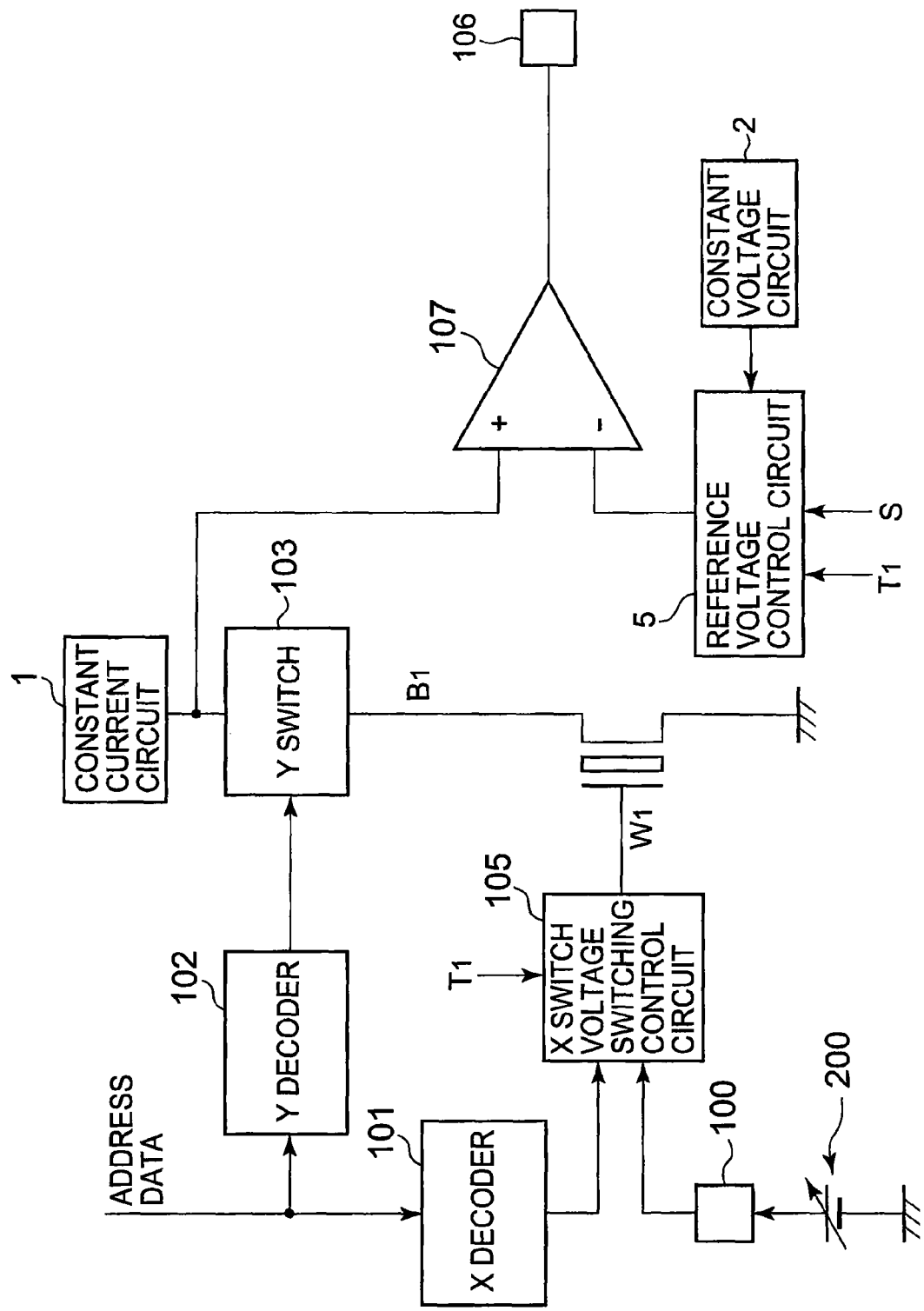
FIG. 7 is a circuit diagram illustrating a structural example of a semiconductor memory device according to a second embodiment of the present invention.

A semiconductor memory device according to a second embodiment is described with reference to FIG. 7. FIG. 7 is a block diagram illustrating a structural example of the semiconductor memory device according to this embodiment. Like reference numerals and symbols are used for components similar to those of the first embodiment of FIG. 2, and description thereof is omitted.

In the case of the second embodiment, the decision level changing circuit 3 is constituted as a reference voltage control circuit 5 as illustrated in FIG. 7.

If the test signal T1 is not input, the reference voltage control circuit 5 delivers the constant voltage delivered from the constant voltage circuit 2 as the reference voltage Vref to the negative terminal of the comparator 107. On the contrary, if the test signal T1 is input, the reference voltage control circuit 5 changes the current value of the reference voltage Vref with respect to the constant voltage by the control signal S and delivers the changed current value as the adjusted reference voltage Vref to the negative terminal of the comparator 107.

In this embodiment, the current delivered from the constant current circuit 1 is supplied as the reference current Iref to the memory cell M via the Y switch 103.

As described above, when data is written in the memory cell M of the EEPROM, the threshold voltage Vth becomes a positive potential. When data is erased, the threshold voltage Vth is apt to be a negative potential.

Therefore, as illustrated in FIGS. 8A and 8B, if the threshold voltage Vth is a positive potential in the test mode, the voltage value of the voltage signal to be applied to the gate of the memory cell M from the external terminal 100 is gradually decreased from a certain value, and hence the ON resistance of the memory cell M is gradually increased. In FIG. 8A, the horizontal axis represents the voltage value of the voltage signal supplied from the external terminal 100 while the vertical axis represents the voltage value of the drain voltage of the memory cell M. Further, in FIG. 8B, the horizontal axis represents the voltage value of the voltage signal supplied from the external terminal 100 while the vertical axis represents a value of the voltage delivered to the external terminal 106.

In this case, if the voltage value of the voltage signal applied to the gate of the memory cell M is sufficiently higher than that of the threshold voltage Vth of the memory cell M, the ON resistance of the memory cell M is sufficiently small for the reference current Iref. Therefore, the drain voltage of the memory cell M at the positive input terminal of the comparator 107 is lower than the reference voltage Vref at the negative input terminal thereof, and hence a logical output of the "L" level is delivered from the output terminal thereof.

However, if the voltage value of the voltage signal to be applied to the gate is decreased to be lower than that of the threshold voltage Vth of the memory cell M, the ON resistance of the memory cell M increases. Then, the reference current Iref cannot flow sufficiently, and hence the drain voltage increases. When the voltage at the positive input terminal (i.e., drain voltage) of the comparator 107 exceeds the reference voltage Vref at the negative input terminal thereof, the logical output delivered from the output terminal thereof is changed from the "L" level to the "H" level.

Here, as to the voltage value of the voltage signal V2 illustrated in FIGS. 8A and 8B, the reference voltage Vref agrees with the drain voltage due to the ON resistance of the memory cell M and the reference current Iref.

On the other hand, if the threshold voltage of the memory cell M is a negative potential, and if the voltage value of the reference voltage Vref when the threshold voltage Vth is a positive potential is used as illustrated in FIGS. 8A and 8B, the voltage value is beyond the range in which the voltage signal that can be measured by the comparator 107 can be adjusted. As described above in the first embodiment, if the threshold voltage Vth of the memory cell M is a negative potential, the ON resistance of the memory cell M is significantly small, and the ON resistance cannot be increased to an extent that the drain voltage exceeds the threshold voltage Vref unless a negative potential voltage signal is applied to the gate.

Therefore, when the negative potential threshold voltage Vth is evaluated in the test mode, the ON resistance of the memory cell M is low compared with the case where the threshold voltage Vth is a positive potential, and hence the drain voltage becomes a lower value compared with the reference voltage Vref if the same reference current Iref is supplied to the drain. For this reason, in this embodiment, the reference voltage Vref is adjusted to be lower than that in the normal mode, whereby the lower drain voltage can also cause the logical inversion of the output of the comparator 107.

As illustrated in FIG. 8A, the voltage value of the reference voltage Vref is decreased compared with that of the voltage value in the normal mode, whereby the voltage value of the voltage signal applied to the gate of the memory cell M is adjusted in a positive potential range. In this case, even if the memory cell M in which the threshold voltage Vth of the memory cell M is a negative potential is not completely turned off, the ON resistance increases as the voltage value of the voltage signal decreases. When the voltage value of the voltage signal decreases to be lower than V1, the drain voltage of the memory cell M exceeds the reference voltage Vref (i.e., Vref that is decreased compared with that in the normal mode), with the result that the logical output of the comparator 107 is changed.

In addition, also in the case where the threshold voltage Vth of the memory cell M is a positive potential, when the reference voltage Vref is decreased, the voltage value of the voltage signal when the drain voltage of the memory cell M exceeds the reference voltage Vref increases from V2 to V3. The voltage value thereof is in the positive potential voltage range, and hence the characteristic evaluation can be performed sufficiently.

As described above, if the reference voltage Vref to be applied to the negative terminal of the comparator 107 is decreased compared with that in the normal mode, it is possible to evaluate the characteristics (including measurement of the threshold voltage Vth) of the memory cell M in both cases of a negative potential and a positive potential.

Figure 9:
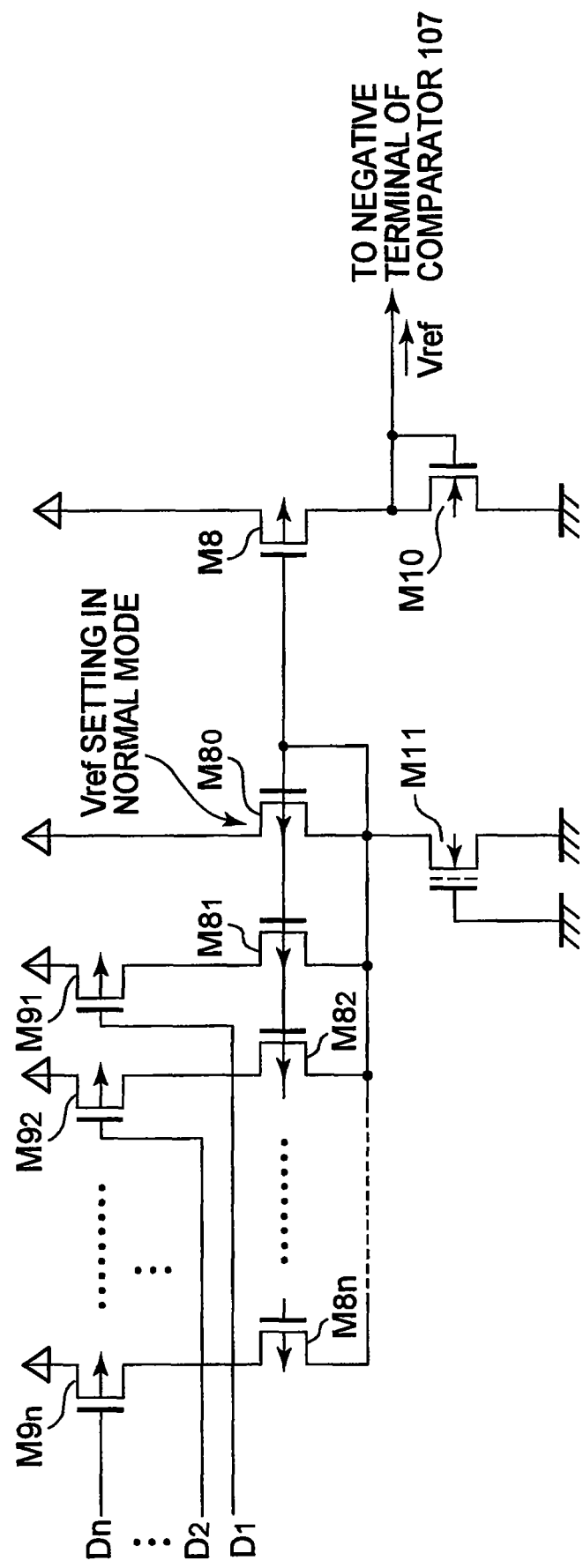
FIG. 9 is a block diagram illustrating a structural example of a reference voltage control circuit illustrated in FIG. 7.
Figure 10:
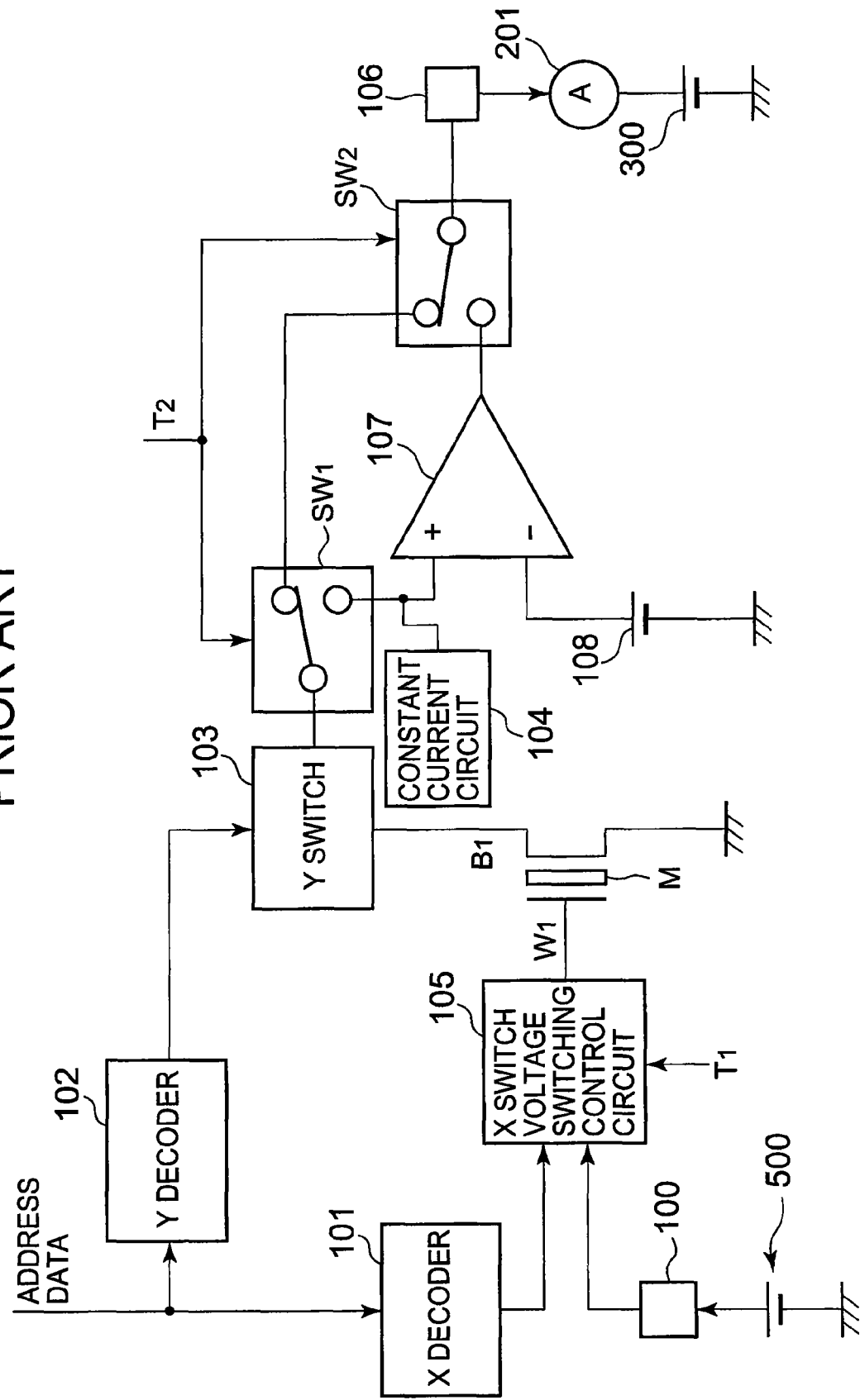
FIG. 10 is a block diagram illustrating a structure of a conventional semiconductor memory device.
Figure 11:
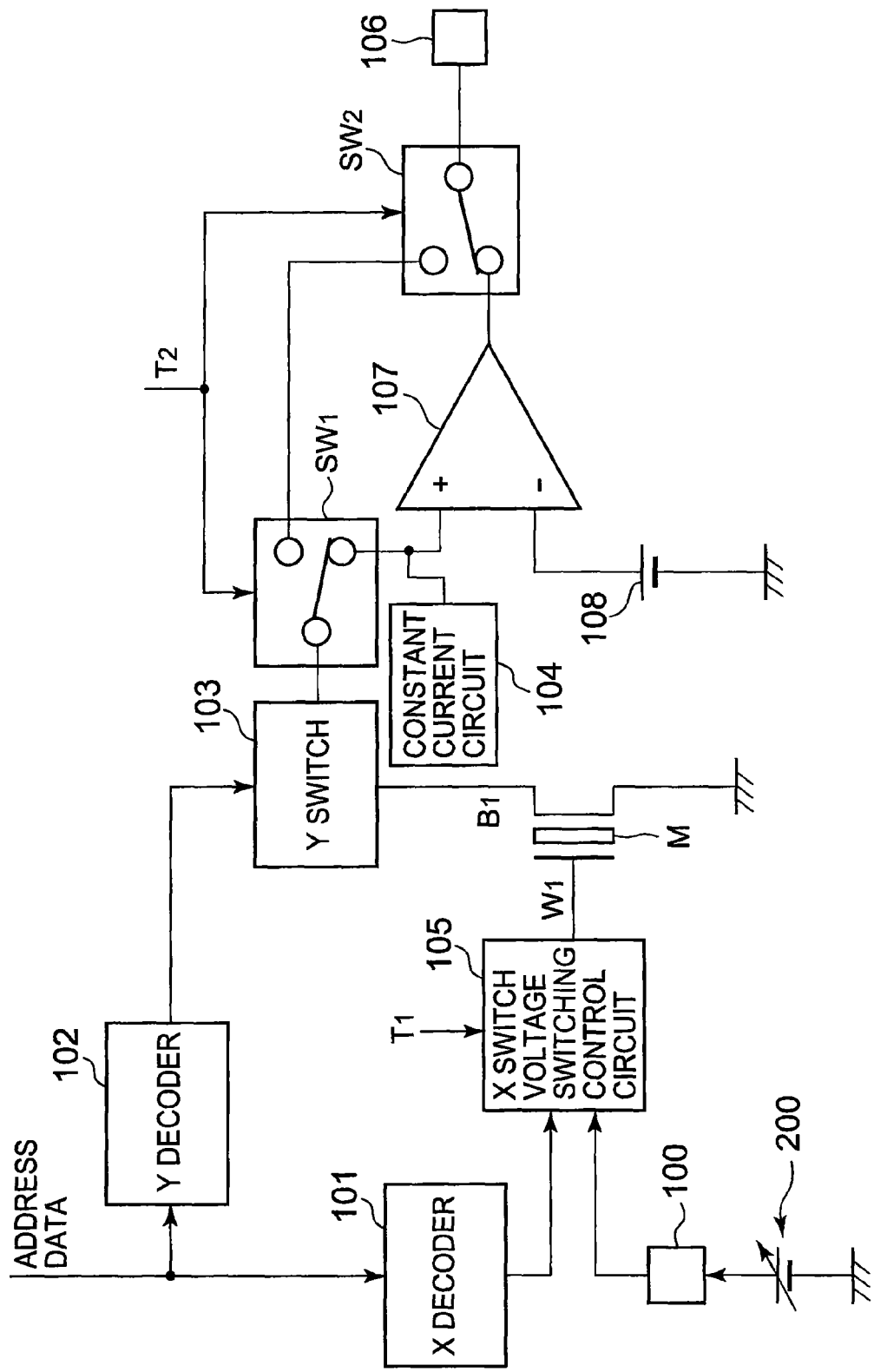
FIG. 11 is a block diagram illustrating a structure of the conventional semiconductor memory device.

In addition, the reference voltage control circuit 5 has the circuit structure as illustrated in FIG. 9, for example, in which the output voltage of the bias circuit is adjusted by the control signals $S\{D_0, D_1, D_2, \ldots, D_n\}$ input externally, and a result of the adjustment is delivered as the reference voltage Vref.

The reference voltage control circuit 5 is made of transistors M8, $M8_0$, $M8_1$, $M8_2$, ..., $M8_n$, and transistors $M9_1$, $M9_2$, ... and $M9_n$ that are p-channel type MOS transistors, a transistor $M1_0$ that is an n-channel type MOS transistor, and a transistor $M1_1$ that is an n-channel depression type MOS transistor.

The transistor M8 and the transistor $M1_0$ constitute the mirror circuit for generating the reference current Iref by the bias voltage supplied from the bias circuit.

Here, the source of the transistor M8 is connected to the power supply voltage, and the drain thereof is connected to the drain of the transistor $M1_0$.

In addition, the transistor $M1_0$ is connected like a diode, i.e., in the transistor $M1_0$, the source is connected to the ground, the gate is connected to the drain, and the drain is connected to the negative terminal of the comparator 107, so as to deliver the reference voltage Vref to the negative terminal thereof.

In addition, a drain of each of the transistors $M8_0$, $M8_1$, $M8_2$, ... and $M8_n$ is connected to a gate thereof and is commonly connected to the drain of the transistor $M1_1$. In addition, each drain thereof is connected to the gate of the transistor M8.

Here, a source of the transistor $M8_0$ is connected to the power supply voltage, and a bias voltage of the voltage value for generating the reference voltage Vref that is necessary for reading data stored in the memory cell M in the normal mode is applied to the gate of the transistor M8.

Each of the other transistors $M8_1$, $M8_2$, ... and $M8_n$ is made to have the same size or different sizes, and is disposed for adjusting the voltage value of the reference voltage Vref in the test mode by the control signal S supplied externally.

Sources of the transistors $M9_1$, $M9_2$, ... and $M9_n$ are connected to the power supply voltage, and drains thereof are connected to the sources of the transistors $M8_1$, $M8_2$, ... and $M8_n$, respectively.

Gates of the transistors $M9_1$, $M9_2$, ... and $M9_n$ are supplied with the control signals $D_1, D_2, \ldots$ and $D_n$ in the control signals $S\{D_1, D_2, D_3, \ldots, D_n\}$, respectively.

The reference voltage control circuit 5 supplies the control signals $S\{D_1, D_2, D_3, \ldots, D_n\}$ to the corresponding gates of the transistors $M9_1$, $M9_2$, ... and $M9_n$, respectively, if the test signal T1 is input. If the test signal T1 is not input, the reference voltage control circuit 5 applies the "H" level voltage to all the gates of the transistors $M9_1$, $M9_2$, ... and $M9_n$, which are turned off so that the reference voltage Vref is generated only by the bias voltage of the transistor $M8_0$.

The drain of the transistor $M1_1$ is connected to the drains of the transistors $M8_0$ to $M8_n$ while the gate and the source thereof are connected to the ground.

As described above, if the threshold voltage Vth of the memory cell M to be evaluated is a positive potential in the test mode, it is possible to evaluate the characteristics of the memory cell M based on the reference voltage Vref of the voltage value that is the same as that in the normal mode.

Therefore, the control signals $S\{D_1, D_2, D_3, \ldots, D_n\}$ are set to be $S\{H, H, H, \ldots, H\}$, and the transistors $M8_1$, $M8_2$, ... and $M8_n$ are all turned off, whereby the bias voltage is generated only by the current value of the transistor $M8_0$. This bias voltage is applied to the gate of the transistor M8 so that the transistor M8 is driven to deliver the reference voltage Vref corresponding to the current value of the transistor $M8_0$.

The above-mentioned reference voltage Vref is used so that the voltage value of the voltage signal supplied from the external terminal 100 is changed within a positive potential range from the voltage that is sufficiently higher than the threshold voltage Vth to zero, whereby the characteristics of the memory cell M can be evaluated.

On the contrary, if the threshold voltage Vth of the memory cell M to be evaluated is a negative potential, it is necessary to apply the voltage signal of a negative potential voltage value to the gate of the memory cell M in order that the memory cell M is completely turned off and that the drain voltage exceeds the reference voltage Vref.

Therefore, for example, the control signals $S\{D_1, D_2, D_3, \ldots, D_n\}$ are set to be $S\{L, H, L, \ldots, L\}$ so that the transistors $M9_1$, $M9_3$ and $M9_n$ are turned on. The values of the currents flowing in the transistors $M8_1$, $M8_3$ and $M8_n$ are added to a value of the current flowing in the transistor $M8_0$, the bias voltage value to be applied to the gate of the transistor M8 is increased, the ON resistance of the transistor M8 is increased, and the voltage value of the reference voltage Vref is decreased.

In this way, the voltage value of the reference voltage Vref is decreased so that the drain voltage of the memory cell M is made to be a value exceeding the voltage value of the reference voltage Vref within a positive potential voltage range. Thus, the characteristic evaluation of the memory cell M can be performed by applying the voltage signal of a positive potential voltage range to the gate of the memory cell M.

In addition, in the case where the reference voltage corresponding to the threshold voltage Vth of the negative potential is used, when the memory cell M of the threshold voltage Vth of the positive potential is measured, the drain voltage of the memory cell M exceeds the reference voltage Vref when the voltage signal supplied from the external terminal 100 is the voltage value V3 that is higher than the voltage value V2 of the voltage signal in the normal mode as illustrated in FIG. 8A.

However, in the test mode, the control signals $S\{D_1, D_2, D_3, \ldots, D_n\}$ may be set as data for measuring the memory cell M of the negative potential threshold voltage, so as to evaluate the characteristics of the memory cell M of the positive potential threshold voltage Vth.

In addition, the current value of the reference current Iref and the voltage value of the reference voltage Vref may be changed simultaneously for adjusting the decision level.

In this case, it is possible to adjust the decision level with higher accuracy compared with the first embodiment or the second embodiment.

What is claimed is:

1. A memory device operable under a normal mode and a test mode, comprising:
   a plurality of memory cells each configured to exhibit two discrete states of positive and negative potentials to thereby store one bit of information;
   a comparator configured to switch a polarity of its output according to a relative voltage difference between a threshold voltage and a cell voltage across a drain and a source of a selected memory cell;
   a variable voltage source operable under the test mode to apply a progressively changing test voltage to a gate of the selected memory cell to progressively change a resistance of the selected memory cell;
   means for defining, under the normal mode, the relative voltage difference such that the comparator switches the polarity of its output under the normal mode so as to indicate the respective states of the selected memory cell, whereas under the test mode, adjusting according to the state of the selected memory cell one of (a) electric current flowing through the selected memory cell and (b) the threshold voltage, such that in the respective states of the selected memory cell, the comparator switches the polarity of its output under the test mode, as the variable voltage source progressively changes the test voltage within a measurable range.

2. The memory device according to claim 1, wherein said means comprises a current source circuit and a voltage source circuit which respectively supply under the normal mode a constant current through the selected memory cell and the constant threshold voltage.

3. The memory device according to claim 2, wherein under the test mode, while the voltage source circuit keeps the threshold voltage constant, the current source circuit adjusts the current supplied through the selected memory cell according to the state of the selected memory cell.

4. The memory device according to claim 3, wherein under the test mode, the current source circuit increases the current supplied through the selected memory cell when the selected memory cell is in the state of negative potential.

5. The memory device according to claim 2, wherein under the test mode, while the current source circuit keeps constant the current supplied though the selected memory cell, the voltage source circuit adjusts the threshold voltage according to the state of the selected memory cell.

6. The memory device according to claim 5, wherein under the test mode, the voltage source circuit lowers the threshold voltage when the selected memory cell is in the state of negative potential.

7. The memory device according to claim 6, wherein under the test mode, the voltage source circuit lowers the threshold voltage when the selected memory cell is in the state of positive potential.

8. The memory device according to claim 2, wherein the current source circuit comprises a current mirror circuit which comprises a plurality of parallelly connected auxiliary current supply circuits selectively switchable to adjust the current supplied through the selected memory cell.

9. The memory device according to claim 2, wherein the current source circuit comprises an analogue transistor controlled by a control signal to variably change the current supplied through the selected memory cell.

10. The memory device according to claim 2, wherein the voltage source circuit comprises a plurality of serially connected auxiliary voltage supply circuits selectively switchable to adjust the threshold voltage.

11. A memory cell testing method, the memory cell exhibiting two states of positive and negative potentials to thereby store one-bit of information, the method comprising:
    monitoring a relative voltage difference between a threshold voltage and a cell voltage across a drain and a source of the memory cell;
    applying a progressively changing test voltage to a gate of the selected memory cell to progressively change a resistance of the memory cell;
    according to the state of the memory cell, adjusting one of (a) electric current flowing through the memory cell and (b) the threshold voltage, such that in the respective states of the memory cell, the cell voltage changes across the threshold voltage, as progressively changing the test voltage within a measurable range.

12. The method according to claim 11, wherein adjusting one of (a) electric current flowing through the memory cell and (b) the threshold voltage comprises keeping the threshold voltage constant and adjusting the current supplied through the memory cell according to the state of the memory cell.

13. The method according to claim 12, wherein adjusting the current supplied through the memory cell according to the state of the memory cell comprises increasing the current supplied through the memory cell when the memory cell is in the state of negative potential.

14. The method according to claim 11, wherein adjusting one of (a) electric current flowing through the memory cell and (b) the threshold voltage comprises keeping constant the electric current supplied though the memory cell and adjusting the threshold voltage according to the state of the selected memory cell.

15. The method according to claim 14, wherein adjusting the threshold voltage according to the state of the selected memory cell comprises lowering the threshold voltage when the memory cell is in the state of negative potential.

16. The method according to claim 14, wherein adjusting the threshold voltage according to the state of the selected memory cell comprises lowering the threshold voltage when the memory cell is in the state of positive potential.

* * * * *